US010292270B2

(12) United States Patent
Nieland et al.

(10) Patent No.: US 10,292,270 B2
(45) Date of Patent: May 14, 2019

(54) CONTACT BUMP CONNECTION AND CONTACT BUMP AND METHOD FOR PRODUCING A CONTACT BUMP CONNECTION

(71) Applicant: SMARTRAC TECHNOLOGY GMBH, Dresden (DE)

(72) Inventors: Carsten Nieland, Gotha (DE); Frank Kriebel, Lichtenberg (DE)

(73) Assignee: SMARTRAC TECHNOLOGY GMBH, Dresden (DE)

( * ) Notice: Subject to any disclaimer, the term of this patent is extended or adjusted under 35 U.S.C. 154(b) by 548 days.

(21) Appl. No.: 14/420,730

(22) PCT Filed: Aug. 9, 2013

(86) PCT No.: PCT/DE2013/000451
§ 371 (c)(1),
(2) Date: Feb. 10, 2015

(87) PCT Pub. No.: WO2014/023287
PCT Pub. Date: Feb. 13, 2014

(65) Prior Publication Data
US 2015/0208508 A1 Jul. 23, 2015

(30) Foreign Application Priority Data
Aug. 10, 2012 (DE) .................. 10 2012 015 811

(51) Int. Cl.
*H05K 1/18* (2006.01)
*H05K 3/30* (2006.01)
(Continued)

(52) U.S. Cl.
CPC ......... *H05K 1/18* (2013.01); *H01L 21/76885* (2013.01); *H01L 23/49811* (2013.01);
(Continued)

(58) Field of Classification Search
CPC .......................... H05K 1/18; H01L 21/76885
See application file for complete search history.

(56) References Cited

U.S. PATENT DOCUMENTS

| 5,483,741 A * | 1/1996 | Akram ............... G01R 1/06738 29/846 |
| 5,640,052 A | 6/1997 | Tsukamoto |

(Continued)

FOREIGN PATENT DOCUMENTS

| CN | 101295692 A | 10/2008 |
| DE | 101 57 205 | 6/2003 |

(Continued)

OTHER PUBLICATIONS

State Intellectual Property Office of People's Republic of China, First Office Action and Search Report, Application No. 201380042531.0, dated Nov. 28, 2016.
(Continued)

*Primary Examiner* — William H. Mayo, III
*Assistant Examiner* — Hiram E Gonzalez
(74) *Attorney, Agent, or Firm* — Patent2ip LLC; Tue Nguyen

(57) ABSTRACT

The invention relates to a contact bump connection (24) and to a method for producing a contact bump connection between an electronic component being provided with at least one terminal face (11) and a contact substrate (26) being contacted with the component and having at least one second terminal face (25), wherein the first terminal face is provided with a contact bump (10), which has a raised edge (15) and has at least one displacement pin (16) in a displacement compartment (18) being surrounded by the raised edge and being open towards a head end of the contact bump, and wherein, in a contact region (31) with the first terminal face, the second terminal face has a contact bead (30), which is formed by displacement of a contact material (Continued)

(29) of the second terminal face into the displacement compartment and which surrounds the displacement pin, said contact bead having a bead crown (33) which is oriented to a bottom (17) of the displacement compartment and is raised relative to a level contact surface (32) of the second terminal face surrounding the contact region.

7 Claims, 2 Drawing Sheets

(51) Int. Cl.
    *H01L 23/00* (2006.01)
    *H01L 21/768* (2006.01)
    *H01L 23/498* (2006.01)
    *H05K 3/34* (2006.01)
(52) U.S. Cl.
    CPC .............. *H01L 24/13* (2013.01); *H01L 24/16* (2013.01); *H01L 24/81* (2013.01); *H05K 3/301* (2013.01); *H01L 24/11* (2013.01); *H01L 2224/0401* (2013.01); *H01L 2224/05567* (2013.01); *H01L 2224/11462* (2013.01); *H01L 2224/11622* (2013.01); *H01L 2224/13006* (2013.01); *H01L 2224/13011* (2013.01); *H01L 2224/13012* (2013.01); *H01L 2224/13019* (2013.01); *H01L 2224/13022* (2013.01); *H01L 2224/16113* (2013.01); *H01L 2224/16225* (2013.01); *H01L 2224/73104* (2013.01); *H01L 2224/73204* (2013.01); *H01L 2224/81191* (2013.01); *H01L 2224/81201* (2013.01); *H01L 2224/81206* (2013.01); *H01L 2224/81345* (2013.01); *H01L 2224/81898* (2013.01); *H01L 2224/83862* (2013.01); *H01L 2224/9211* (2013.01); *H01L 2224/92125* (2013.01); *H01L 2924/00014* (2013.01); *H05K 3/3431* (2013.01); *H05K 2201/1059* (2013.01); *H05K 2201/10674* (2013.01); *H05K 2201/10954* (2013.01); *H05K 2203/0415* (2013.01); *Y10T 29/4913* (2015.01); *Y10T 29/49018* (2015.01)

(56) References Cited

U.S. PATENT DOCUMENTS

| | | | | |
|---|---|---|---|---|
| 6,419,143 | B2* | 7/2002 | Hembree | B23K 20/10 228/1.1 |
| 6,469,532 | B2* | 10/2002 | Akram | G01R 31/2886 324/756.05 |
| 8,102,021 | B2* | 1/2012 | Degani | G06K 19/07749 257/532 |
| 2001/0054771 | A1* | 12/2001 | Wark | G01R 1/06738 257/786 |
| 2004/0183182 | A1 | 9/2004 | Swindlehurst | |
| 2004/0197979 | A1 | 10/2004 | Jeong | |
| 2008/0295318 | A1 | 12/2008 | Bohn | |
| 2011/0068473 | A1* | 3/2011 | Lee | H01L 23/49811 257/773 |

FOREIGN PATENT DOCUMENTS

| | | |
|---|---|---|
| DE | 10 2005 012496 | 10/2006 |
| JP | 2000 114314 | 4/2000 |
| JP | 2005 197488 | 7/2005 |
| JP | 2006 310477 | 11/2006 |
| WO | 00/48242 | 8/2000 |

OTHER PUBLICATIONS

English Language Translation of the PCT International Preliminary Report on Patentability, PCT/DE2013/000451, dated Feb. 19, 2015, 13 pages.

International Search Report dated Feb. 3, 2014 for International Application No. PCT/DE2013/000451.

Kim, J.H. et al., "Soldering Method Using Longitudinal Ultrasonic," IEEE Transactions on Components and Packaging Technologies, IEEE Service Center, Piscataway, N.J., U.S., vol. 28, No. 3, Sep. 1, 2005; ISSN 1521-3331.

* cited by examiner

CONTACT BUMP CONNECTION AND CONTACT BUMP AND METHOD FOR PRODUCING A CONTACT BUMP CONNECTION

CROSS-REFERENCE TO RELATED APPLICATIONS

This application represents the national stage entry of PCT International Application No. PCT/DE2013/000451 filed Aug. 9, 2013 and claims the benefit of German Patent Application No. 10 2012 015 811.4 filed Aug. 10, 2012. Further, U.S. patent application Ser. No. 14/094,714 filed Dec. 2, 2013 is a continuation-in-part of PCT International Application No. PCT/DE2013/000451. The contents of these applications are hereby incorporated by reference as if set forth in their entirety herein.

The present invention relates to a contact bump connection between an electronic component being provided with at least one terminal face and a contact substrate being contacted with the component and having at least one second terminal face as well as to a contact bump for producing a contact bump connection and to a method for producing a contact bump connection.

Contact bump connections of the type mentioned at the beginning regularly serve for contacting terminal faces of a chip with terminal faces of a contact substrate. In particular, such contact connections, in which the chip, by means of a so-called "flip chip" method, is arranged on the contact substrate with its terminal faces being oriented against the terminal faces of the contact substrate, are used for producing so-called "noncontact chip cards", which enable contactless data transmission between the chip and a data reader by means of an antenna being contacted with the terminal faces of the contact substrate.

Generally speaking, "flip chip" contacting of chips requires the terminal faces of the chip to be prepared with contact elevations, which are often also referred to as "bumps" in technical jargon. By means of said contact bumps, it is possible to contact the terminal faces of the chip with the terminal faces of the contact substrate in an electrically conductive way, without wire conductors or other contact devices that are independent of the chip being necessary.

From document DE 101 57 205 A1, a method for producing contact bumps is known, the method making it possible to form contact bumps, which have a particular surface topography, having an upper part of the contact bump, which has protuberances that are for example formed like pillars or stars and that are supposed to enable an improved accommodation of connecting material, said material, acting in the manner of adhesives or of soldering materials, for example, being supposed to make it possible to produce an electrically conductive connection between the contact bumps being arranged on the terminal faces of the chip and terminal faces of a contact substrate. Furthermore, the known surface topography of the contact bumps is supposed to make it possible to break up oxide layers on the terminal faces of the contact substrate and, finally, is supposed to produce a mechanical bond with the terminal faces of the contact substrate, also because of the protuberances of the contact bumps coming into engagement.

Hereunto, surface topographies of the contact bumps are proposed, having, on a contact pedestal of the contact bump, protuberances being formed in different ways or being arranged in different ways, wherein the protuberances are either located in a central region of the contact pedestal or in an edge area of the edge pedestal and are supposed to enable local indenting with the contact metallization of the contact substrate by way of an engagement with the contact material of the terminal faces of the contact substrate.

In experiments, it has now been found out that contact bump connections having contact bumps of the above-described type are characterized by a high shearing strength. However, the tensile strengths which are achieved when trying to separate the chip from the contact substrate are not very satisfactory, such that, in the known contact bump connections, for sufficient mechanical securing, it is, in addition to mechanically connecting the contact bumps and the contact metallization of the contact substrate, necessary to use an adhesive between the chip and the contact substrate.

When using adhesives for contacting chips on contact substrates in a mechanically durable or stable way, it has in principle been found out to be disadvantageous that the output figures that can be achieved when producing such connections are limited as a result of the reaction time that is regularly necessary for hardening an adhesive connection.

Therefore, the present invention is based on the object of proposing a contact bump connection that makes it possible to produce a mechanical connection being permanently durable and resisting the mechanical stresses occurring in practice, even without using additional connecting materials, such as adhesives in particular.

Said object is attained by way of a contact bump connection having the features of claim 1.

In the contact bump connection in accordance with the invention, the first terminal face is provided with a contact bump, which has a raised edge and has at least one displacement pin in a displacement compartment being enclosed by the raised edge and being open towards a head end of the contact bump, and the second terminal face, in a contact region with the first terminal face, has a contact bead, which is formed by displacement of a contact material of the second terminal face into the displacement compartment and which surrounds the displacement pin, said contact bead having a bead crown which is oriented to a bottom of the displacement compartment and is raised relative to a level contact surface of the second terminal face surrounding the contact region.

Hence, the contact bump connection in accordance with the invention has a positive fit between the contact bump being arranged on the first terminal face and the contact material of the second terminal face, wherein the displacement compartment has an internal limitation by way of the contact pin and an external limitation by way of the raised edge, in such a manner that massive displacement of the contact material within the displacement compartment of the contact bump is effected, such that a bead crown extending to the bottom of the displacement compartment is formed and that a correspondingly extensive axial penetration between the contact bump and the contact material is the result. As a result of the radially internal as well as radially external limitation of the displacement compartment, by way of the displacement pin and of the raised edge, the contact material is exposed to compressive forces both being oriented radially towards the inside and radially towards the outside, such that, at the contact faces between the contact material and the displacement pin on the one hand and the contact material and the raised edge on the other hand, the contact material is made to fit tightly against the surface topography of the raised edge, in which procedure the contact material fills any uneven patches or indentations in the surface topography of the walls of the displacement compartment and fills up potential undercuts in the walls of the displacement compartment.

The result thereof is that there is not only an axial penetration between the contact bump of the electronic component, which means of the chip, for example, and the contact material of the contact substrate, but also, beyond that, a radial penetration or a radial engagement of the contact bump with the contact material, such that the contact bump connection is able to absorb tensile stresses acting on the contact bump connection in a separative way.

Such tensile stresses occur, for example, in connection with a bending stress of a chip card, which is, in practice, the decisive stress putting the function of a chip card at risk.

In a preferred embodiment of the contact bump connection, the raised edge is formed circumferentially and limits the displacement compartment peripherally, such that a particularly strong displacement effect is obtained.

It proves to be particularly advantageous for achieving high tensile strengths of the contact bump connection if a free end of the displacement pin is arranged beneath an upper edge of the raised edge, in such a manner that the displacement compartment is divided into a displacement compartment section extending from the free end of the displacement pin up to the upper edge of the raised edge, said displacement compartment section not resisting displacement, and into a displacement compartment section extending from the bottom of the displacement compartment up to the free end of the displacement pin, said displacement compartment section being provided with the displacement pin serving as a displacement resistance element and resisting displacement.

The displacement compartment section not resisting displacement is the first section to be filled with contact material when producing such a contact bump connection, wherein the press-in resistance, when producing the connection, during this first phase, can be overcome with relatively little press-in force due to the fact that there is no displacement resistance in this compartment not resisting displacement. Only after continued displacement of the contact material into the displacement compartment section resisting displacement, when the press-in procedure is carried on with, the press-in force rises, induced by the increased internal pressure in the compartment resisting displacement. Hereby, at the beginning of the mechanical contact to the contact material, it is possible to already position the contact bump in a targeted way with the smallest possible press-in force, only increasing the press-in force after a contact has been established, in order to finally conclude the production of the mechanically stable and positively fitting connection by forming the bead crown in the displacement compartment.

It is particularly advantageous if the displacement compartment section resisting displacement is formed as an annular compartment, such that a symmetrical compressive stress is the result in the contact plane between the contact bump and the contact material.

It is particularly advantageous if the first terminal face is formed from a terminal face of a chip or of a chip module and if the second terminal face is formed from a terminal end of an antenna conductor, such that the material for forming the antenna conductor simultaneously forms the contact material of the terminal faces of the contact substrate and that a particularly immediate contacting is thus made possible between the contact bump and an electronic component being formed on the contact substrate, the electronic component namely being the antenna conductor.

The contact bump in accordance with the invention has the features of claim 6.

In accordance with the invention, the contact bump has a raised edge and has at least one displacement pin in a displacement compartment being surrounded by the raised edge and being open to a head end of the contact bump, which displacement pin, in combination with the displacement compartment being limited by the raised edge radially on the outside, has the advantages that have already been explained in detail above.

Preferably, the raised edge is formed circumferentially and limits the displacement compartment peripherally, such that the raised edge encircles the displacement compartment and that a particularly strong displacement effect is obtained.

Preferably, the free end of the displacement pin is arranged beneath an upper edge of the raised edge, such that, in the contact bump, the displacement compartment, as it has already been explained above, is divided into a displacement compartment section above the displacement pin not resisting displacement and into a displacement compartment section resisting displacement, which reaches from the bottom of the displacement compartment up to the free end of the displacement pin.

Preferably, by arranging the displacement pin in the displacement compartment between the raised edge and the displacement pin, an annular compartment is formed.

The method in accordance with the invention has the features of claim 10.

In accordance with the invention, for producing a mechanical connection of the terminal faces, the contact bump being arranged on the first terminal face is pressed into a contact surface of a contact material of the second terminal face, in such a manner that, in the displacement compartment of the contact bump, while the raised edge and the displacement pin penetrate into the contact material of the second terminal face, in relation to the press-in direction, said contact material is exposed to pressure both by the raised edge radially towards the inside and by the displacement pin radially towards the outside, in order to make it possible that the contact material, as it has already been explained in detail above, advantageously in the radial direction fits tightly against or penetrates into the wall face limiting the displacement compartment radially on the outside by way of the raised edge and the wall face limiting the displacement compartment radially on the inner side by way of the displacement pin.

Preferably, in a first phase of producing the connection, the contact material of the second terminal face, in the displacement compartment of the contact bump, is exposed to pressure radially towards the inside by the raised edge of the contact bump until reaching the free end of the connection pin, and, in a second phase of producing the connection, when the contact bump continues to penetrate into the contact material of the second terminal face, the contact material is exposed to pressure both radially towards the inside and radially towards the outside by the raised edge and by the connection pin.

When the press-in procedure of the contact bump of the first terminal face into the contact material of the second terminal face is superposed with vibrations, the depth to which the contact material penetrates into the wall faces of the displacement compartment can further be boosted.

Preferably, the superposition with vibrations is effected in a transverse plane with respect to the press-in direction, wherein an ultrasonic device being known per se can in particular be used, for exposing the chip to the press-in force and to the vibrations from the rear and transversely with respect to the press-in direction.

Alternatively or also additionally, the superposition with vibrations can also be effected in the press-in direction.

Application of the method proves to be particularly advantageous for producing a contact bump connection between an electronic component being provided with first terminal faces and being embodied as a chip and a contact substrate being contacted with the component and being embodied as an antenna substrate, wherein the terminal ends of an antenna conductor simultaneously form the terminal faces of the contact substrate.

In the following, with the aid of the drawing, a preferred embodiment of a contact bump as well as of a contact bump connection being produced by means of the contact bump is explained in more detail.

Figure 1:
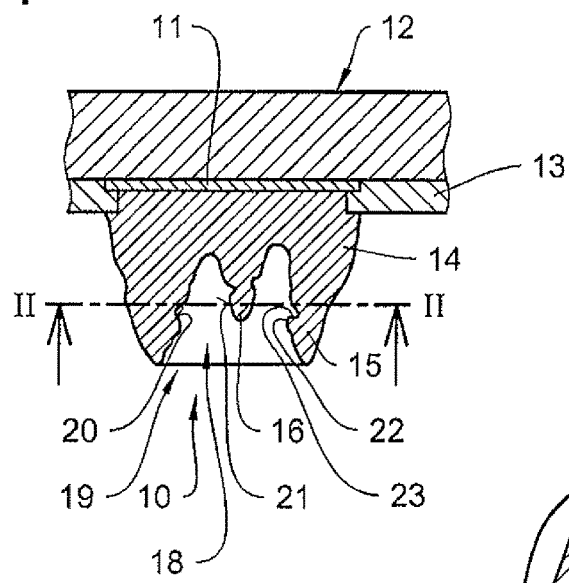
FIG. 1 shows a contact bump in a sectional illustration.

FIG. 1 shows a contact bump 10, which is arranged on a terminal face 11 of a chip 12, wherein a chip surface being adjacent to the contact bump is provided with a passivation 13.

Figure 2:
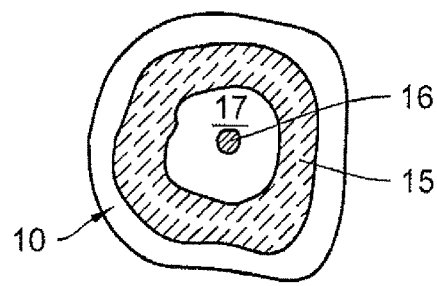
FIG. 2 shows a cross-sectional illustration of the contact bump being illustrated in FIG. 1 in accordance with sectional line II-II in FIG. 1.

The contact bump 10 being illustrated in FIGS. 1 and 2 has a contact bump base 14, which is provided with a raised edge 15 being circumferential in a completely annular way here and with a central displacement pin 16, which is arranged on a bottom 17 of a displacement compartment 18 being limited radially towards the outside by way of the raised edge 15.

The contact bump 10 being illustrated in FIGS. 1 and 2 can in principle be produced in different manners, wherein, for producing the contact bump 10, a production by means of current-free precipitation of palladium or precipitation of a palladium alloy on the terminal face 11 of the chip 12 in combination with a photolithographic method is suitable in a particular manner, as it is, for example, described in document WO 2000/048242 A1, the content of which is incorporated into the present application documents by way of reference.

By means of the precipitation method, the topography of the surface of the contact bump 10 being illustrated in FIG. 1 can be produced, wherein an exterior wall 20 limiting the displacement compartment 18 radially on the outside and substantially widening towards a displacement compartment opening 19 in a conical way and an interior wall 21 of the displacement compartment being defined by the displacement pin 16 and being tapered towards the displacement compartment opening 19 in a conical way are provided with irregularities, which form projections 22 and indentations 23.

Figure 3:
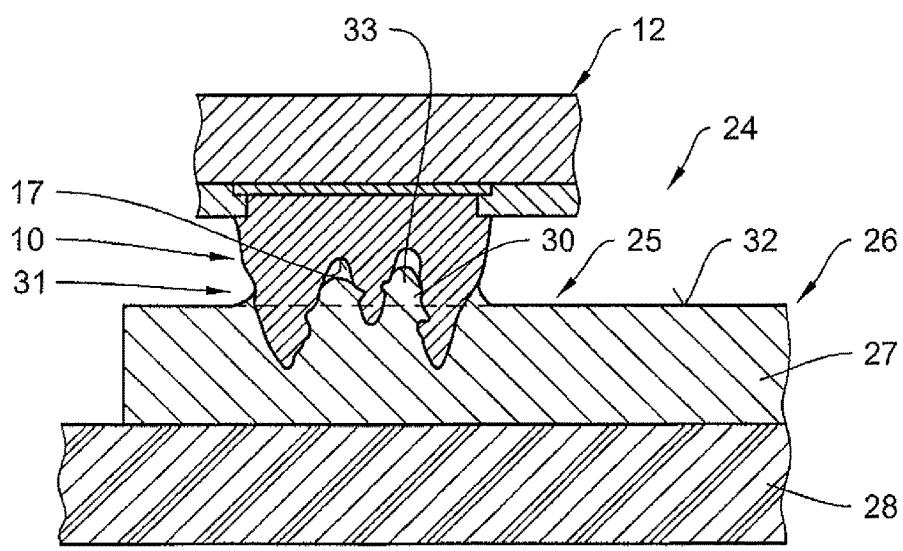
FIG. 3 shows a contact bump connection in a sectional illustration.

FIG. 3 shows a contact bump connection 24, in which the contact bump 10 being arranged on the terminal face 11 of the chip 12 is connected to a terminal face 25 of a contact substrate 26, wherein, in the present case, the terminal face 25 is formed by a terminal end of an antenna conductor 27, which is arranged like a wire or in the shape of a strip conductor structure, for example being formed by means of coating, on a substrate being formed as a carrier foil 28.

For producing the contact bump connection 24 being illustrated in FIG. 3, the contact bump 10 is pressed into the terminal face 25 being formed by the terminal end of the antenna conductor 27 from above, wherein the contact material 29 being formed by the antenna conductor 27 in the present case is displaced into the displacement compartment 18 until a deformation of the contact material 29 has finally arisen at the end of the press-in procedure, as it is illustrated in FIG. 3, in such a manner that within the displacement compartment 18, a contact bead 30 encircling the displacement pin 16 is formed, having a bead crown 33 being oriented to the bottom 17 of the displacement compartment 18 and being raised relative to a contact surface 32 surrounding a contact region 31 between the contact bump 10 and the terminal face 25.

Figure 4:
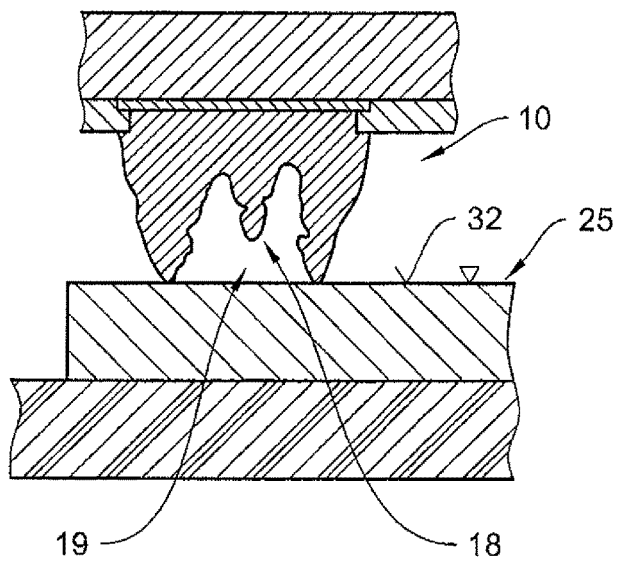
FIG. 4 to FIG. 6 show different phases in the production of a contact bump connection.
Figure 5:
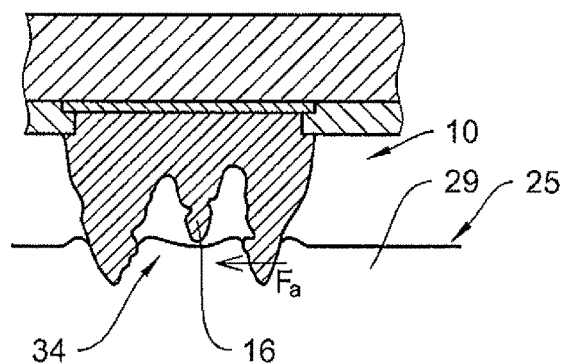
Figure 6:
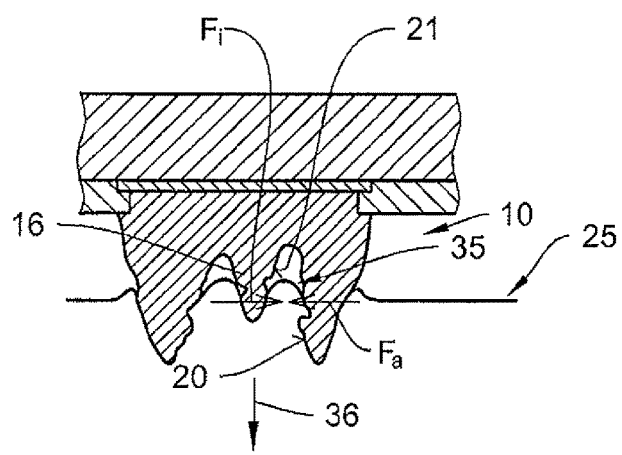

In FIGS. 4 to 6, the press-in procedure is schematically illustrated in its different phases, wherein FIG. 4 shows the contact bump 10 immediately before penetrating into the contact surface 32 of the terminal face 25, the contact surface just having been formed. FIG. 5 shows a first displacement phase, in which the contact material 29, through the displacement compartment opening 19, penetrates into a displacement compartment section 34 that does not have any displacement body, such that displacement of the contact material 29 into displacement compartment section 34 is mainly caused as a result of a displacement pressure $F_a$ radially acting on the contact material 29 through the exterior wall 20 of the displacement compartment 18 from the outside.

When the press-in procedure is carried on with, the contact material 29 having been displaced into the displacement compartment 18 reaches, as it is illustrated in FIG. 6, a displacement compartment section 35 that has the displacement pin 16 as a displacement body, such that, into the displacement compartment section 35, a displacement pressure $F_i$ being oriented towards the inside acts on the contact material, not only radially from the outside through the exterior wall 20 of the displacement compartment 18, but also radially from the inside through the interior wall 21 being formed by the displacement pin 16, resulting in the displacement being effected faster, forming the bead crown 33 being illustrated in FIG. 3, and being effected with a simultaneous rise in the force being necessary for press-in.

As a result of the external pressure $F_a$ acting on the contact material 29 and of the internal pressure $F_i$ acting on the contact material 29, the contact material 29 is made to fit tightly against the exterior wall 20 and against the interior wall 21 of the displacement compartment 18, wherein the contact material proceeds along the outline of the projections 22 in the exterior wall 20 and in the interior wall 21 and is similarly pressed into the indentations 23 of the exterior wall 20 and of the interior wall 21, such that not only an axial engagement between the contact bump 10 and the contact material 29 is effected in the press-in direction 36, but also a transverse or radial engagement with respect to the press-in direction 36.

In case an additional reinforcement of the mechanical connection between the electronic component, which means the chip, for example, and the contact substrate is desired, before or after producing the contact bump connection, in the surroundings of the contact bump and/or in the surroundings of the terminal face of the contact substrate, a polymer adhesive can be applied onto the electronic component and/or onto the contact substrate.

In particular when using a pressure-sensitive adhesive, the adhesive can be cross-linked during production of the contact bump connection. When using a temperature-sensitive adhesive, the adhesive can be cross-linked by way of subsequent temperature exposure after having produced the contact bump connection.

In principle, there is a sufficiently mechanically stable contact bump connection, even without any additional adhesive connection, such that any reaction times for cross-linking or hardening the adhesive do not have any influence on the time that is needed for producing the contact bump connection. The connection time is solely determined by the duration of the press-in procedure when producing the contact bump connection.

The invention claimed is:

1. A method for producing a contact bump connection, said method comprising:
    pressing a contact bump arranged on a first terminal face into a contact surface of a contact material of a second terminal face in a press-in direction,
    wherein pressing comprises driving the contact bump to penetrate into the contact material, said contact bump having a raised edge and at least one displacement pin in a displacement compartment being surrounded by the raised edge and being open towards a head end of the contact bump,
    wherein said pressing occurring in such a manner that, in the displacement compartment of the contact bump, while the raised edge and the displacement pin penetrate into the contact material of the second terminal face, in relation to the press-in direction, said contact material is exposed to pressure both by the raised edge radially inwardly and by the displacement pin radially outwardly,
    wherein the contact material moves into to the displacement compartment in response to the pressure exposure,
    wherein, in a first phase of producing the connection, the contact material of the second terminal face, in the displacement compartment of the contact bump, is exposed to pressure radially inwardly by the raised edge of the contact bump until reaching the free end of the connection pin, and
    wherein, in a second phase of producing the connection, when the contact bump continues to penetrate into the contact material of the second terminal face, the contact material is exposed to pressure radially inwardly by the raised edge and radially outwardly by the connection pin.

2. The method according to claim 1, in which during pressing of the contact bump into the contact material said pressing is superposed with vibrations.

3. The method according to claim 2, in which the superposition with vibrations is effected in a transverse plane with respect to the press-in direction.

4. The method according to claim 2, in which the superposition with vibrations is effected in the press-in direction.

5. The method according to claim 1, further comprising, before pressing the contact bump into the contact surface,
    forming the contact bump on the first terminal face of a chip, the first terminal face forming part of the chip being arranged on a chip substrate,
    approaching the contact bump to the contact surface of the contact material of the second terminal face of an antenna being arranged on an antenna substrate, said second terminal face being formed by a terminal end of an antenna conductor.

6. The method according to claim 1, further comprising depositing the contact bump on the first terminal face in such a way so that the contact bump has a raised edge and at least one displacement pin in a displacement compartment being surrounded by the raised edge and being open towards a head end of the contact bump.

7. A method for producing a contact bump connection, said method comprising:
    pressing a contact bump arranged on a first terminal face into a contact surface of a contact material of a second terminal face in a press-in direction,
    wherein pressing comprises driving the contact bump to penetrate into the contact material, said contact bump having a raised edge and at least one displacement pin in a displacement compartment being surrounded by the raised edge and being open towards a head end of the contact bump,
    wherein said pressing occurring in such a manner that, in the displacement compartment of the contact bump, while the raised edge and the displacement pin penetrate into the contact material of the second terminal face, in relation to the press-in direction, said contact material is exposed to pressure both by the raised edge radially inwardly and by the displacement pin radially outwardly,
    wherein the contact material moves into the displacement compartment in response to the pressure exposure,
    wherein the displacement pin is completely disposed in the displacement compartment without protruding through the opening surface of the displacement compartment.

* * * * *